United States Patent
Degani

(10) Patent No.: US 6,342,399 B1
(45) Date of Patent: Jan. 29, 2002

(54) TESTING INTEGRATED CIRCUITS

(75) Inventor: Yinon Degani, Highland Park, NJ (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/435,971

(22) Filed: Nov. 8, 1999

(51) Int. Cl.[7] .............................................. H01L 22/61
(52) U.S. Cl. ........................... 438/14; 438/15; 257/784; 257/685; 324/765
(58) Field of Search ..................... 438/14, 15; 257/784, 257/685; 324/765

(56) References Cited

U.S. PATENT DOCUMENTS

| | | | |
|---|---|---|---|
| 5,502,333 A | * | 3/1996 | Bertin et al. ................ 257/685 |
| 5,946,545 A | * | 8/1999 | Bertin et al. ................... 438/15 |
| 6,166,556 A | * | 12/2000 | Wang et al. ................. 324/765 |
| 6,184,587 B1 | * | 2/2001 | Khandros et al. ........... 257/784 |

* cited by examiner

Primary Examiner—John F. Niebling
Assistant Examiner—Olivia T Luk
(74) Attorney, Agent, or Firm—Peter V. D. Wilde; Thomas, Kayden, Horstemeyer & Risley LLP

(57) ABSTRACT

The specification describes a technique for burn-in electrical testing of IC dies prior to wire bonding the dies to the next interconnection level. The dies are provided with a test solder bump array interconnected to the IC contact pads of the dies. The Known Good Dies (KGD) can then be wire bonded, or alternatively flip-chip solder bump bonded, to the next interconnect level.

8 Claims, 4 Drawing Sheets

TESTING INTEGRATED CIRCUITS

FIELD OF THE INVENTION

This invention relates to techniques for testing semiconductor integrated circuit (IC) devices, and more specifically to testing wire bonded IC devices.

BACKGROUND OF THE INVENTION

Electrical testing of IC devices is a significant component of the cost of the final IC product. Considerable development and test tool investment is made in this aspect of IC manufacture. In Multi-Chip-Module (MCM) packaging, the test strategy is especially critical. Testing the final product, the conventional approach generally favored from the standpoint of both cost and reliability, is not optimum for MCM products since the final yield is a multiple of the yield for each individual die in the MCM package. For example, if each of the dies in the package has a yield of 95%, an MCM with 3 dies will have a yield of only 85.7%. Thus in some IC device packaging, notably MCM packaging, it becomes important to fully test the dies before assembly to identify the Known Good Dies (KGD). This typically involves both electrical functionality tests, and aging or burn-in tests. Burn-in tests are especially important for memory dies, which typically exhibit a 1–5% burn-in failure rate over dies that have been only functionally tested. However, burn-in tests require robust and reliable electrical probe connections. Consequently, it has been the pattern, where devices are mounted using solder bumps, to apply the solder bumps to the device, and employ special testing apparatus that electrically connects to the solder bumps. An example of one of several test approaches that can be used is described and claimed in my co-pending application Ser. No. 09/366,388, filed Aug. 3, 1999, which is incorporated herein by reference, is the use of a silicon test bed in which a pattern of recesses or sockets is etched into a silicon wafer, and the recesses are interconnected to a test circuit that simulates the device circuit. The layout of recesses is made to accommodate the solder ball array on the IC device. The use of silicon as the test bed offers the advantages of high planarity, thermal properties that match the IC substrate, notably coefficient of thermal expansion, and the availability of a well developed interconnect technology for fabricating the test circuit. This test approach and test apparatus works well with IC chips or MCMs that are solder bump mounted, and have an array of solder bumps accessible for testing, but it appears inconsistent with IC devices that are packaged using wire bonds and have only pads accessible. Wire bond interconnections for integrated circuit devices have been widely used in IC packaging because they are relatively inexpensive and are highly reliable. However, burn-in testing IC devices after wire bonding is done in the final package and the die cannot be used for MCMs, and burn-in testing the dies before wire bonding using bare bonding pads is relatively ineffective. A state-of-the-art high pin count wire bonded IC package that avoids this problem is described and claimed in my co-pending application Ser. No. 09/361,100, filed Jul. 1, 1999, which is incorporated herein by reference. This package uses an intermediate interconnection substrate (IIS) and the IC dies are bump mounted on the IIS. However, many IC packages still have IC dies that are directly wire bonded to the next interconnection level. It would be desirable to have a test procedure for burn-in testing of these IC dies that has the effectiveness and process integration compatibility of the bum-in test for bump-bonded devices.

STATEMENT OF THE INVENTION

I have developed an IC testing approach for IC dies with wire bond pads that allows effective mounting of the dies for burn-in testing, and thereafter allows interconnection of these dies to the next board level using wire bonds. The wire bond pads are re-routed to bump-bond sites and the dies are provided with bump-bonds for the burn-in test. After test the KGD are packaged using either bump bonds or wire bonds, and can be mounted either face down for bump-bonding or face up for wire bonding.

DETAILED DESCRIPTION

Figure 1:
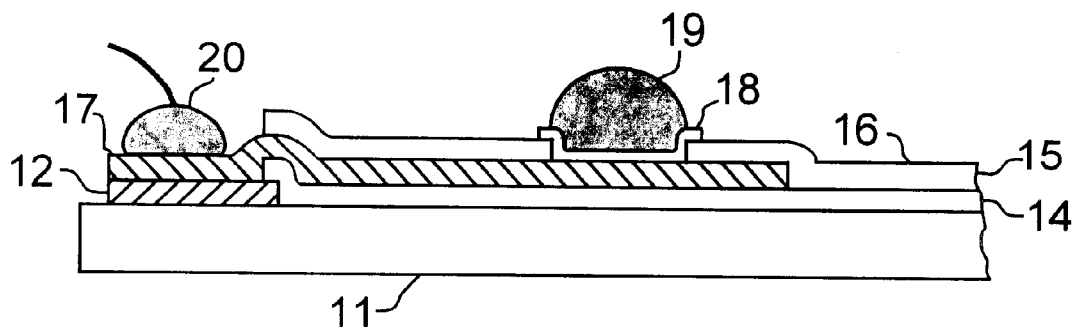
FIG. 1 is a schematic view of a portion of an integrated circuit device showing the bump array used for burn-in testing, and the wire bonds used for wire bonding to the next interconnection level.

Referring to FIG. 1 a semiconductor IC substrate 11 is shown with a standard IC contact pad 12 on the surface thereof. The substrate contains IC circuit elements (not shown). The semiconductor is typically silicon but may be a III-V semiconductor such as GaAs or InP for high speed transistors or photonic devices. The top metallization layer of the IC die includes contact pads for interconnection. In silicon based technology, these usually comprise aluminum. After the last metal level is defined and the contact pads formed, the top surface of the IC device is typically encapsulated with passivating layer 14. Several passivating materials are known and used, such as silicon nitride (SINCAPS), but the preferred choice is polyimide. A polyimide layer is easily patterned to expose the contact pads 12 as shown in FIG. 1. Photodefinable polymers can be used, and patterned using photolithography. A conductive runner 15, such as aluminum, is routed from contact pad 12 to another location on the surface of passivating layer 14. The runner 15 is covered with another insulating layer 16, is such as polyimide. Layer 16 is patterned to expose the portion 17 of runner 15 at or near contact pad 12, and a second opening is made at another contact region to expose runner 15. The second opening is provided with Under Bump Metallization (UBM) 18 and solder bump 19. Wire bond 20 is shown contacting the portion of runner 15 over the contact pad 12. It is evident that solder bump 19 is electrically connected to contact pad 12, and can be used for burn-in testing of the IC using an array of conventional test probes. The wire bond site is shown directly over contact pad 12 but can be offset from the pad if desired.

Figure 2:
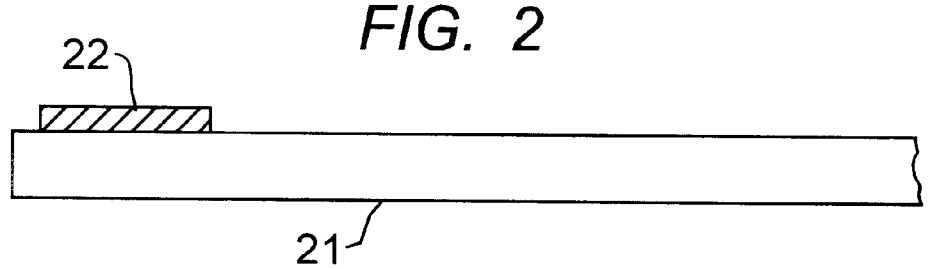
FIGS. 2–12 are schematic representations of process steps useful for the manufacture of the IC dies of the invention.
Figure 3:
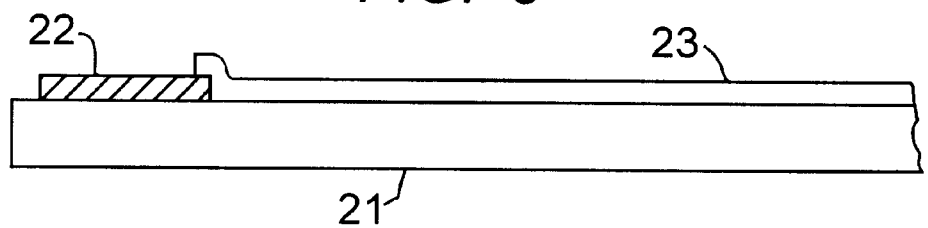
Figure 4:
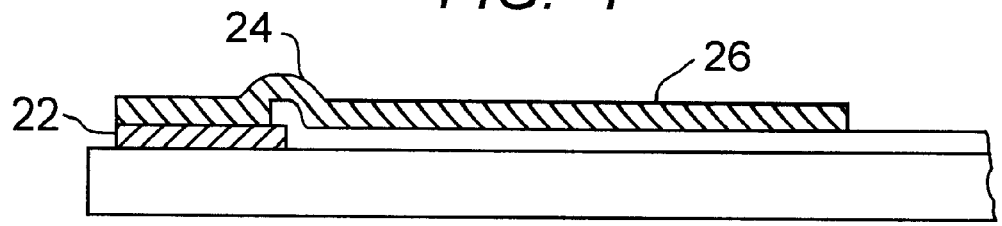

A suitable processing sequence for the manufacture of devices illustrated generally in FIG. 1 will be described in conjunction with FIGS. 2–12. FIG. 2 shows substrate 21 with contact pad 22 on the surface thereof. The substrate is a portion of a standard semiconductor wafer. Processing according to this embodiment of the invention through the solder bump stage is performed at the wafer level. Testing may be at the wafer level or after singulation, as desired. FIG. 3 shows substrate 21 after deposition and patterning of polyimide layer 23. Layer 23 may be selectively applied by, e.g. screen printing, or may be applied by spin coating, and patterning using photolithography or other subtractive technique. With contact pad 22 exposed, conductive layer 24 is blanket deposited over the substrate by a suitable deposition technique such as sputtering, as shown in FIG. 4. Layer 24 is preferably aluminum but may be chosen from other conductive materials such as gold, gold alloy, TiPdAu, or may be formed as part of the UBM process in which case a UBM material such as CrCu may be used. The thickness of layer 24 may typically be in the range 0.3–3.0 μm. Layer 24 is patterned as indicated schematically in FIG. 4 to provide a conductive runner interconnecting contact pad 22 with a solder bump site indicated here at 26. The solder bump site 26 can be located anywhere on the surface of the substrate thereby providing the option of re-arranging the interconnection array of contact pads to another configuration represented by bump site 26. It is preferred that the solder bump site and the contact pad be located in relatively close proximity so as to minimize the length of IC interconnections.

Figure 5:
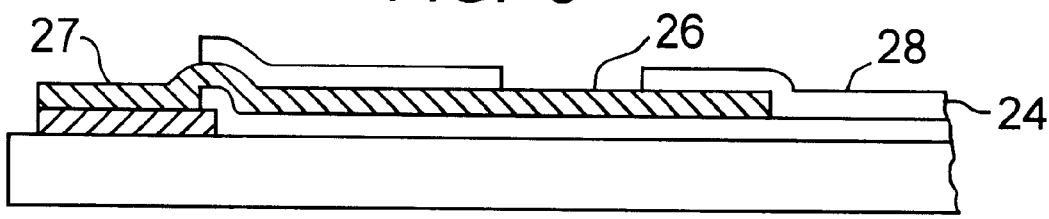
Figure 6:
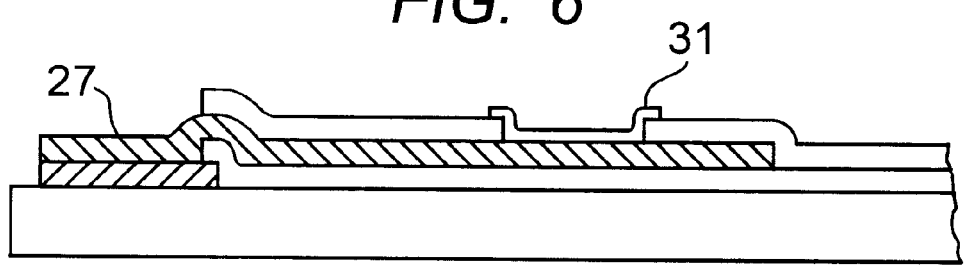

With reference to FIG. 5, a second patterned polyimide layer 28 is selectively formed, as with layer 23, over the surface of the substrate and patterned to reveal region 26 —the solder bump site— of runner 24, and a second region 27 at or near contact pad 22. A UBM layer 31 is applied to solder bump site 26 as illustrated in FIG. 6. The material of runner 24 will typically be aluminum, and it is well known that aluminum is not a desirable material to solder. Consequently the practice in the industry is to apply a UBM coating on the portions of aluminum that are to be soldered, and reflow the solder to the UBM. The metal or metals used in UBM technology must adhere well to aluminum, be wettable by typical solder formulations, and be highly conductive. A structure meeting these requirements is a composite of chromium and copper. Chromium is deposited first, to adhere to the aluminum, and copper is applied over the chromium to provide a solder wettable surface. Chromium is known to adhere well to a variety of materials, organic as well as inorganic. Accordingly it adheres well to dielectric materials, e.g. $SiO_2$, SINCAPS, polyimide, etc., commonly used in IC processing, as well as to metals such as copper and aluminum. However, solder alloys dissolve copper and de-wet from chromium. Therefore, a thin layer of copper directly on chromium will dissolve into the molten solder and the solder will then de-wet from the chromium layer. To insure interface integrity between the solder and the UBM, a composite or alloy layer of chromium and copper is typically used between the chromium and copper layers.

The aforementioned layers are conventionally sputtered, so several options for depositing them are conveniently available. The layer can be sputtered from an alloy target. It can be sputtered using a chromium target, then changing to a copper target. Optionally it can be sputtered using separate chromium and copper targets, and transitioning between the two. The latter choice produces a layer with a graded composition, and is a preferred technique.

As suggested earlier, runner 24 may be formed as part of the UBM process in which case runner 24 will comprise CrCuCr, or a suitable alternative. In this case the wire bond site 27 may be coated with a material to which standard gold or gold alloy wires can be effectively thermocompression bonded. The preferred choice is aluminum, which in the sequence shown, is selectively applied to cover site 27. This step may be performed at any point in the sequence prior to the wire bonding step.

Figure 7:
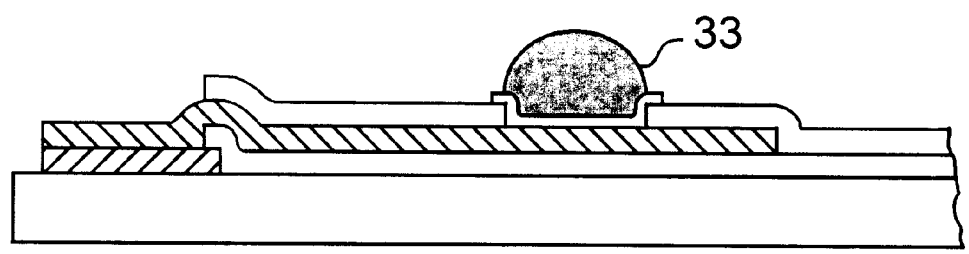

Referring to FIG. 7, solder bumps or solder balls 33 are then applied to the UBM. The solder bumps or balls are conventionally used for flip-chip mounting of IC dies, and can be formed by any suitable technique such as ball placement or solder paste printing. The thickness of a typical solder bump for this application is 5–30 mils. Examples of solder compositions that can be used successfully in the processes described here are given in the following table:

TABLE I

| composition | Sn | Pb | Sb | Ag | solidus ° C. | liquidus ° C. |
|---|---|---|---|---|---|---|
| I | 63 | 37 | | | 183 | 183 |
| II | 95 | | 5 | | 235 | 240 |
| III | 96.5 | | | 3.5 | 220 | 220 |

Figure 8:
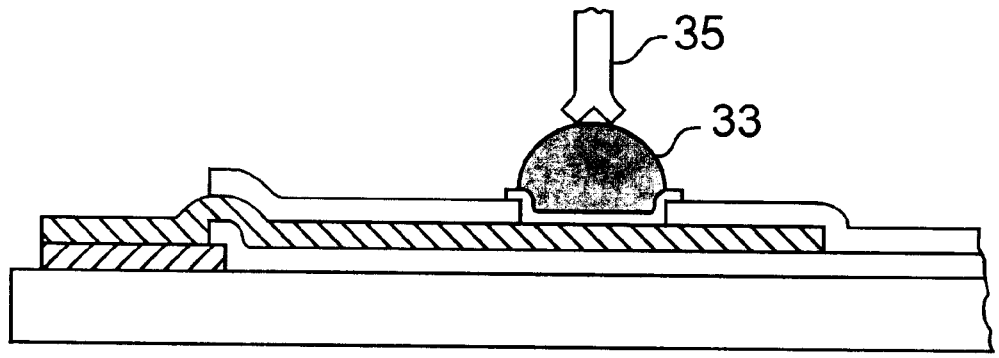
Figure 9:
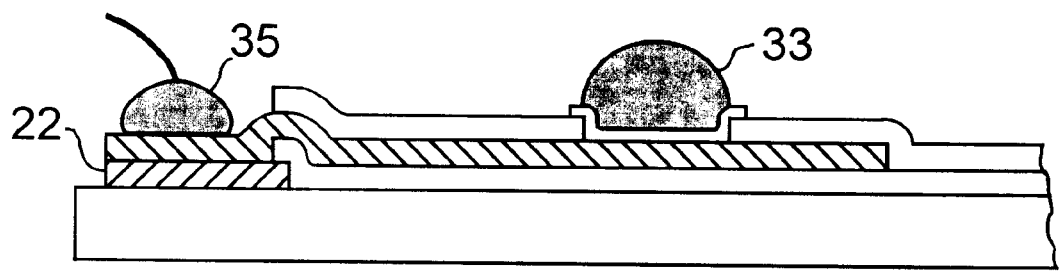

Using the array of solder bumps formed in the previous step, the IC device can now be tested with both functional testing and burn-in testing by conventional probes represented by 35 in FIG. 8. After testing, the KGD are assembled in, e.g., an MCM package. The option of interconnecting the IC shown in the figures using wire bonding is schematically represented in FIG. 9, where both a solder bump 33, and a wire bond 35 are shown connected to the same electrical node, i.e. contact pad 22.

Figure 10:
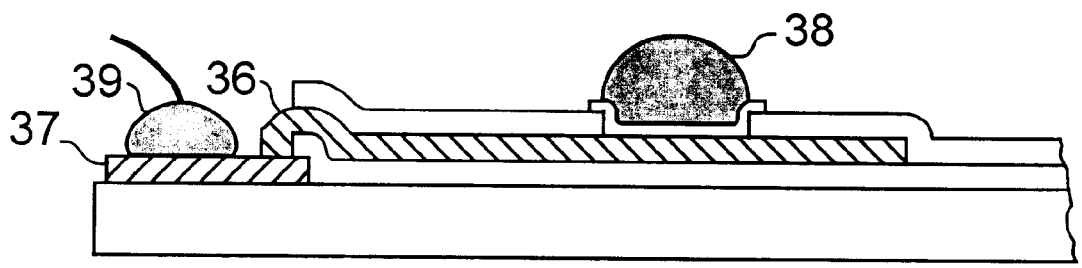

As mentioned earlier the UBM layer can serve as the interconnection runner between the solder bumps and the IC contact pads. A relatively simple approach to this is to pattern the UBM layer to provide the UBM and the runner contacting the IC contact pads, but forming the runner so as to contact, e.g. overlap, the edge of the IC contact pads but not cover them. Reliable interconnection is thereby provided while leaving a suitable area of the aluminum contact pad for wire bonding. This approach is illustrated in FIG. 10 where layer 36 covers a portion of aluminum IC contact pad 37 and interconnects the pad to solder bump 38 but layer 36 leaves sufficient area of the pad uncovered to accommodate wire bond 39.

It will occur to those skilled in the art that the invention may be practiced by reversing the positions of the solder bump site and the wire bonding site. Either site may overlie the IC contact pad 22. Alternatively, neither site need overlie the contact pad. Thus it will be appreciated that the approach of the invention provides wide flexibility for the interconnection strategy.

Figure 11:
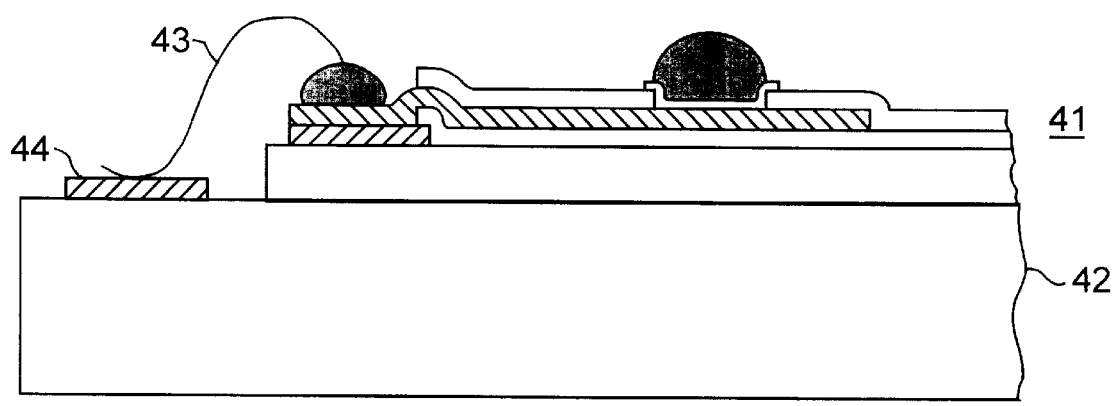
Figure 12:
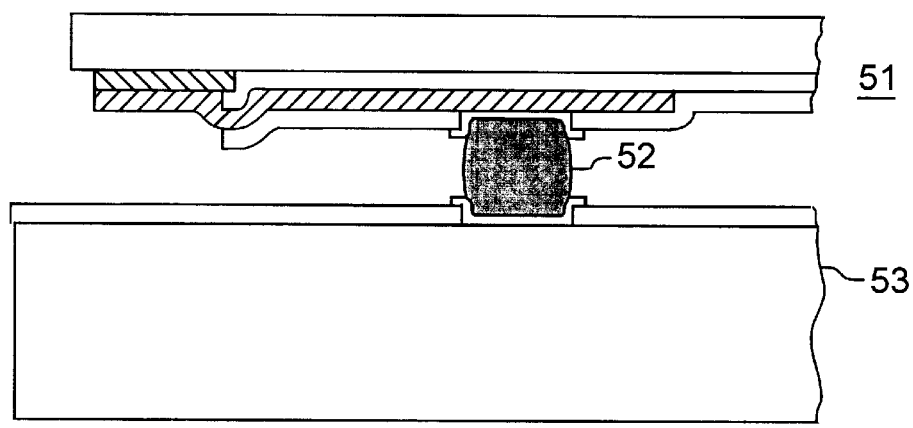

Situations may arise in which an economic approach is to produce a large quantity of KGD using the technique described above, and later mount some of those chips by flip-chip, and others using wire bonds. These alternatives are shown in FIGS. 11 and 12. Referring to FIG. 11, IC device 41 is shown die bonded to an interconnection substrate 42, and wire bonded with wire 43 to an interconnection pattern 44 on substrate 42. The substrate may be an epoxy printed circuit board (PCB), or may be a ceramic or silicon interconnect substrate. The substrate may also be another active IC chip. The IC devices may be packaged or unpackaged. Referring to FIG. 12, other KGD 51 are shown flip-chip bonded, with microbumps represented by 52, to multi-chip module (MCM) substrate 53. The MCM substrate 53 may in turn be flip-chip mounted onto another interconnect substrate. The latter substrate may be an epoxy PCB with a cavity to accommodate device 51 in a recessed configuration.

It will be understood by those skilled in the art that, for simplicity in illustration, only a single solder bump and a single wire bond interconnection are shown in these figures. Typically there will be dozens or even hundreds of solder bumps to be interconnected for test, and a corresponding number of wire bonds for permanent interconnection.

The pitch of contact pads for a bumped IC chip in current technology is of the order of 50–900 μm and the spacing between pads may be 20–500 μm. The bumps are typically 15–150 μm in height (z-direction). The IC device is usually square or rectangular with sides typically in the 2–20 mm range.

The step of electrically testing the IC devices according to the invention involves the application of test voltages to selected solder bumps on the IC die. Thus in a typical manufacturing operation using the invention, IC devices would be conveyed from the singulation or packaging operation to a placement tool, then individually placed with the solder bumps aligned to the test array. Alternatively, the IC devices may be tested at the wafer level. The electrical test procedure itself is conventional and comprises the steps of applying test voltages to the test array, measuring the test voltages, comparing the measured test voltages to a set of predetermined IC device voltages, and selecting those IC devices with test voltages that meet said set of predetermined IC device voltages for final assembly, i.e. bonding the IC device to a permanent interconnection substrate. As will be understood by those skilled in the art the steps of measuring, comparing and selecting are carried out by automated software driven means. For burn-in tests, the devices are typically exposed to an elevated temperature, e.g. 85–125° C., prior to measuring.

Various additional modifications of this invention will occur to those skilled in the art. All deviations from the specific teachings of this specification that basically rely on the principles and their equivalents through which the art has been advanced are properly considered within the scope of the invention as described and claimed.

I claim:

1. A method for manufacturing an integrated circuit (IC) device comprising the steps of:
   a. forming an array of IC contact pads on a semiconductor IC device substrate, said IC device substrate having at least one IC device thereon,
   b. forming an interconnection runner interconnecting said array of IC contact pads to an array of solder bump sites,
   c. forming solder bumps on said solder bump sites, and thereafter
   d. electrically testing said IC device by electrically contacting said solder bumps with an array of sockets, and
   e. interconnecting said IC device substrate to an interconnection substrate using wire bond interconnections.

2. The method of claim 1 wherein the step of electrically testing said IC device includes burn-in electrical testing.

3. The method of claim 2 wherein said semiconductor IC device substrate is silicon.

4. The method of claim 3 wherein said interconnection runner comprises aluminum.

5. The method of claim 3 further including the step of applying under bump metallization (UBM) to said solder bump sites.

6. The method of claim 5 wherein said interconnection runner and said UBM are formed in the same step.

7. A method for manufacturing an IC device comprising the steps of:
   a. forming an array of IC contact pads on a semiconductor IC device substrate, said IC device substrate having at least one IC device thereon,
   b. depositing a polyimide layer to cover said IC device substrate except for at least a portion of said array of IC contact pads,
   c. depositing a conductive layer on said IC device substrate,
   d. patterning said conductive layer to form a plurality of first regions and a plurality of second regions, said first plurality of regions being connected to said second plurality of regions, and said first and second plurality of regions electrically connected to said array of IC contact pads,
   e. forming solder bumps on said first plurality of regions, and thereafter
   f. electrically testing said IC device by electrically contacting said solder bumps with an array of sockets, and
   g. interconnecting said IC device substrate to an interconnection substrate by wire bonding said second plurality of regions to said interconnection substrate.

8. A method for manufacturing IC devices comprising the steps of:
   a. processing a group of IC devices by:
      i. forming an array of IC contact pads on a semiconductor IC device substrate, said IC device substrate having at least one IC device thereon,
      ii. depositing a polyimide layer to cover said IC device substrate except for at least a portion of said array of IC contact pads,
      iii. depositing a conductive layer on said IC device substrate,
      iv. patterning said conductive layer to form a plurality of first regions and a plurality of second regions, said first plurality of regions being connected to said second plurality of regions, and said first and second plurality of regions electrically connected to said array of IC contact pads,
      v. forming solder bumps on said first plurality of regions, and thereafter
      vi. electrically testing said IC device by electrically contacting said solder bumps with an array of sockets,
   b. interconnecting a first portion of said group of IC devices to an interconnection substrate by wire bonding said second plurality of regions to said interconnection substrate and
   c. interconnecting a second portion of said group of IC devices to an interconnection substrate by bump bonding said solder bumps on said first plurality of regions to said interconnection substrate.

* * * * *